(12) United States Patent
Speer et al.

(10) Patent No.: US 10,079,223 B2
(45) Date of Patent: Sep. 18, 2018

(54) CLIPS DEFINING ELECTRICAL PATHWAY ON A FLEXIBLE SHEET

(71) Applicants: Richard Speer, Concord, MA (US); Kenneth Grossman, Beverly, MA (US)

(72) Inventors: Richard Speer, Concord, MA (US); Kenneth Grossman, Beverly, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 15/354,790

(22) Filed: Nov. 17, 2016

(65) Prior Publication Data

US 2018/0138156 A1  May 17, 2018

(51) Int. Cl.
*H01L 25/075* (2006.01)
*H01L 23/498* (2006.01)
*H01L 33/62* (2010.01)
*H01L 27/15* (2006.01)
*H01L 23/00* (2006.01)
*H01L 25/04* (2014.01)
*H01L 23/14* (2006.01)

(52) U.S. Cl.
CPC ...... *H01L 25/0753* (2013.01); *H01L 23/4985* (2013.01); *H01L 23/49805* (2013.01); *H01L 23/49811* (2013.01); *H01L 23/49827* (2013.01); *H01L 23/49838* (2013.01); *H01L 24/16* (2013.01); *H01L 24/81* (2013.01); *H01L 24/95* (2013.01); *H01L 27/153* (2013.01); *H01L 33/62* (2013.01); *H01L 23/145* (2013.01); *H01L 25/048* (2013.01); *H01L 27/156* (2013.01); *H01L 2224/16245* (2013.01); *H01L 2224/8188* (2013.01); *H01L 2224/81815* (2013.01); *H01L 2224/95115* (2013.01); *H01L 2933/0066* (2013.01)

(58) Field of Classification Search
CPC ............ H01L 25/0753; H01L 23/4985; H01L 23/49805; H01L 23/49838; H01L 23/49827; H01L 33/62; H01L 27/153
See application file for complete search history.

(56) References Cited

U.S. PATENT DOCUMENTS

| 6,727,197 B1 | 4/2004 | Wilson et al. |
| 2014/0061684 A1* | 3/2014 | Marutani ............... H01L 33/62 257/88 |
| 2014/0268779 A1 | 9/2014 | Sorensen et al. |
| 2015/0129909 A1 | 5/2015 | Speer et al. |
| 2016/0113118 A1 | 4/2016 | Pereyra et al. |

* cited by examiner

Primary Examiner — Daniel Luke
(74) Attorney, Agent, or Firm — Edward S. Podszus

(57) ABSTRACT

A conductive pathway mounted on an electrically insulating sheet having an upper face and an opposed lower face, said sheet having a plurality of pairs of apertures; a plurality of electrically conductive clips, each clip being separated spatially from an adjacent said clip; each electrically conductive clip comprising a first body portion and first and second depending legs defining a sheet-receiving recess therebetween, said first body portion being disposed in contacting relation with said upper face of said sheet and said legs being disposed in contacting relation with said lower face of said sheet; each leg of one of said electrically conductive clips extending through one of said apertures of a pair of said apertures from said upper face to said lower face; and a plurality of electrical components each mounted in conductive relationship to two adjacent said conductive clips and bridging said insulating sheet.

20 Claims, 3 Drawing Sheets

CLIPS DEFINING ELECTRICAL PATHWAY ON A FLEXIBLE SHEET

CROSS REFERENCE TO RELATED APPLICATIONS

N/A

TECHNICAL FIELD

The present disclosure relates to an electrically conductive pathway formed on a flexible, electrically insulating sheet, wherein the pathway comprises a plurality of electrically conductive clips, and a plurality of electrical components in electrically conductive relationship via the electrically conductive clips.

BACKGROUND AND ACKNOWLEDGED PRIOR ART

The following flexible substrate strip LED light engines as taught by the assignee of the present application are known, U.S. Pat. Pub. 2016/0113118 (Pereyra et al.) and U.S. Pat. Pub. 2015/0129909 (Speer et al.).

SUMMARY

In at least one embodiment, the present disclosure provided a conductive pathway (10) mounted on an electrically insulating sheet (12), comprising: the electrically insulating sheet (12) having an upper face (20) and an opposed lower face (22), said electrically insulating sheet having a plurality of pairs of apertures (30, 32); a plurality of electrically conductive clips (40), each electrically conductive clip (40) being separated spatially from an adjacent said electrically conductive clip (40); each electrically conductive clip (40) comprising a first body portion (42) and first and second depending legs (44, 46), said first and second legs defining a sheet-receiving recess (48) therebetween, said first body portion (42) being disposed in contacting relation with said upper face (20) of said electrically insulating sheet (12) and said first and second legs (44, 46) being disposed in contacting relation with said lower face (22) of said electrically insulating sheet (12); each leg (44, 46) of one of said electrically conductive clips (40) extending through one of said apertures (30, 32) of a pair of said apertures (30, 32) from said upper face (20) of said electrically insulating sheet (12) to said lower face (22) of said electrically insulating sheet (12); and a plurality of electrical components (70), each electrical component (70) mounted in conductive relationship to two adjacent said electrically conductive clips (40) and bridging said insulating sheet (12), thereby defining said conductive pathway (10).

In at least one embodiment said sheet (12) is clamped between said first body portion (42) and said first and second depending legs (44, 46).

In at least one embodiment, each electrically conductive clip (40) of said plurality of electrically conductive clips (40) is formed of metal.

In at least one embodiment, said metal of each electrically conductive clip (40) has a thickness in a range of 0.0015 inch to 0.007 inch.

In at least one embodiment, said metal of each electrically conductive clip (40) has a polygonal shape in cross-section.

In at least one embodiment, said polygonal shape is rectangular.

In at least one embodiment, said first and second depending legs (44, 46) of each electrically conductive clip (40) are substantially parallel with said first body portion (42) of each clip.

In at least one embodiment, said electrically insulating sheet (12) has a longitudinal direction and a width direction transverse to said longitudinal direction; each electrically conductive clip (40) of said plurality of electrically conductive clips (40) has a longitudinal direction; and said longitudinal direction of each of said electrically conductive clips (40) is parallel to said longitudinal direction of said electrically insulating sheet (12).

In at least one embodiment, said two adjacent electrically conductive clips (40) are separated spatially by a gap (60) located therebetween; and each electrical component (70) mounted in conductive relationship to said two adjacent electrically conductive clips (40) bridges said gap (60) between said two adjacent electrically conductive clips (40).

In at least one embodiment, each of said apertures (30, 32) of said plurality of pairs of apertures (30, 32) is rectangular.

In at least one embodiment, said electrically insulating sheet (12) has a longitudinal direction and a width direction transverse to said longitudinal direction; each of said rectangular apertures (30, 32) of the plurality of apertures (30, 32) has a longitudinal direction; and said longitudinal direction of each of said rectangular apertures (30, 32) of said plurality of apertures (30, 32) is transverse to said longitudinal direction of said electrically insulating sheet (12).

In at least one embodiment, each of said apertures (30, 32) of said plurality of pairs of apertures (30, 32) have at least one of a same size and a same shape.

In at least one embodiment, said electrically insulating sheet (12) is formed of a plastic composition comprising at least one polymer.

In at least one embodiment, said at least one polymer comprises at least one of polyethylene terephthalate and polyethylene napthalate.

In at least one embodiment, said electrically insulating sheet (12) has a thickness in a range of 0.003 inch to 0.008 inch.

In at least one embodiment, each electrical component (70) of said plurality of electrical components (70) comprises a solid-state light source.

In at least one embodiment, each electrical component (70) of said plurality of electrical components (70) is mounted to said two adjacent electrically conductive clips (40) by a fastening pad (58).

In at least one embodiment, said fastening pad (58) is formed of an electrically conductive polymer composition or metal solder.

BRIEF DESCRIPTION OF FIGURES

The above-mentioned and other features of this disclosure, and the manner of attaining them, will become more apparent and better understood by reference to the following description of embodiments described herein taken in conjunction with the accompanying drawings, wherein.

DETAILED DESCRIPTION INCLUDING BEST MODE OF A PREFERRED EMBODIMENT

Figure 1:
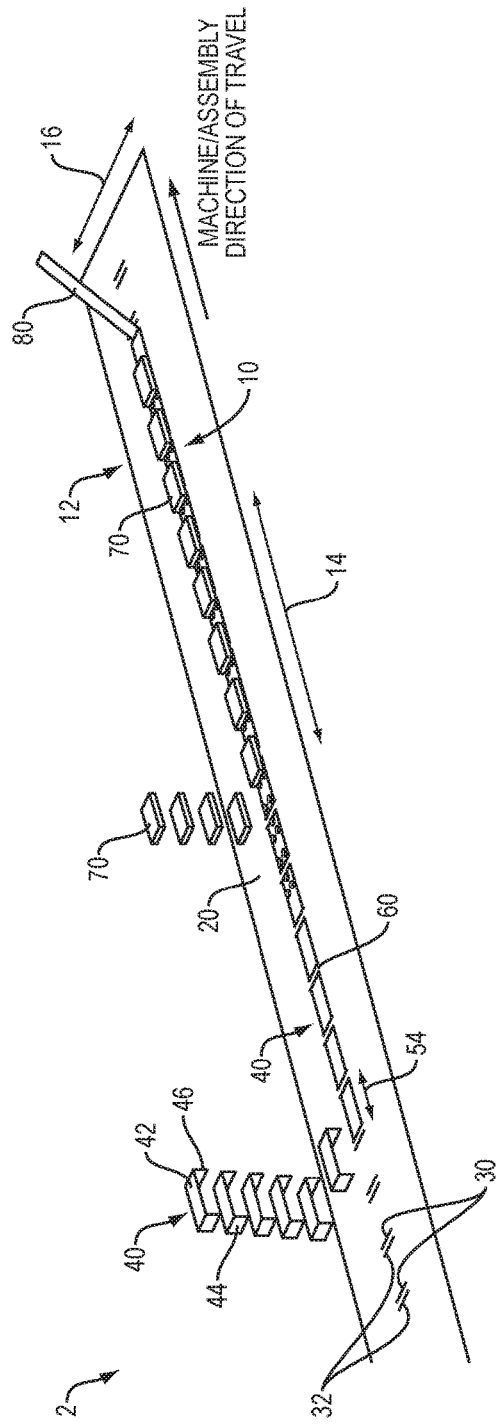
FIG. 1 is a top perspective view of an electrically conductive pathway on a flexible, electrically insulating sheet according to the present disclosure.

It may be appreciated that the present disclosure is not limited in its application to the details of construction and the arrangement of components set forth in the following description or illustrated in the drawings. The embodiments herein may be capable of being practiced or being carried out in various ways. Also, it may be appreciated that the phraseology and terminology used herein is for the purpose of description and should not be regarded as limiting as such may be understood by one of skill in the art.

Figure 2:
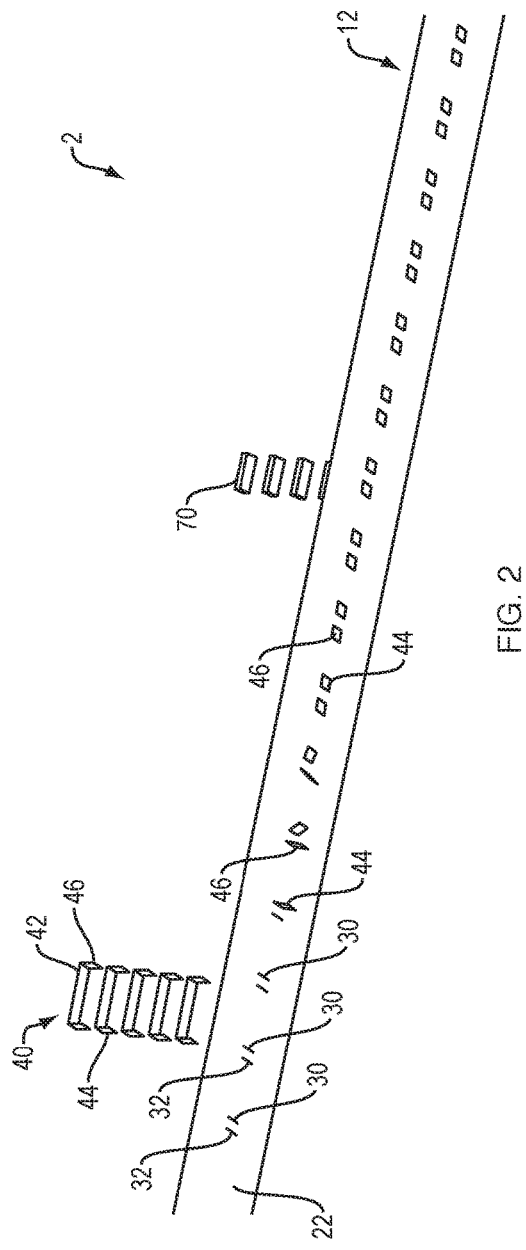
FIG. 2 is a bottom perspective view of the electrically conductive pathway on the flexible, electrically insulating sheet of FIG. 1.
Figure 3:
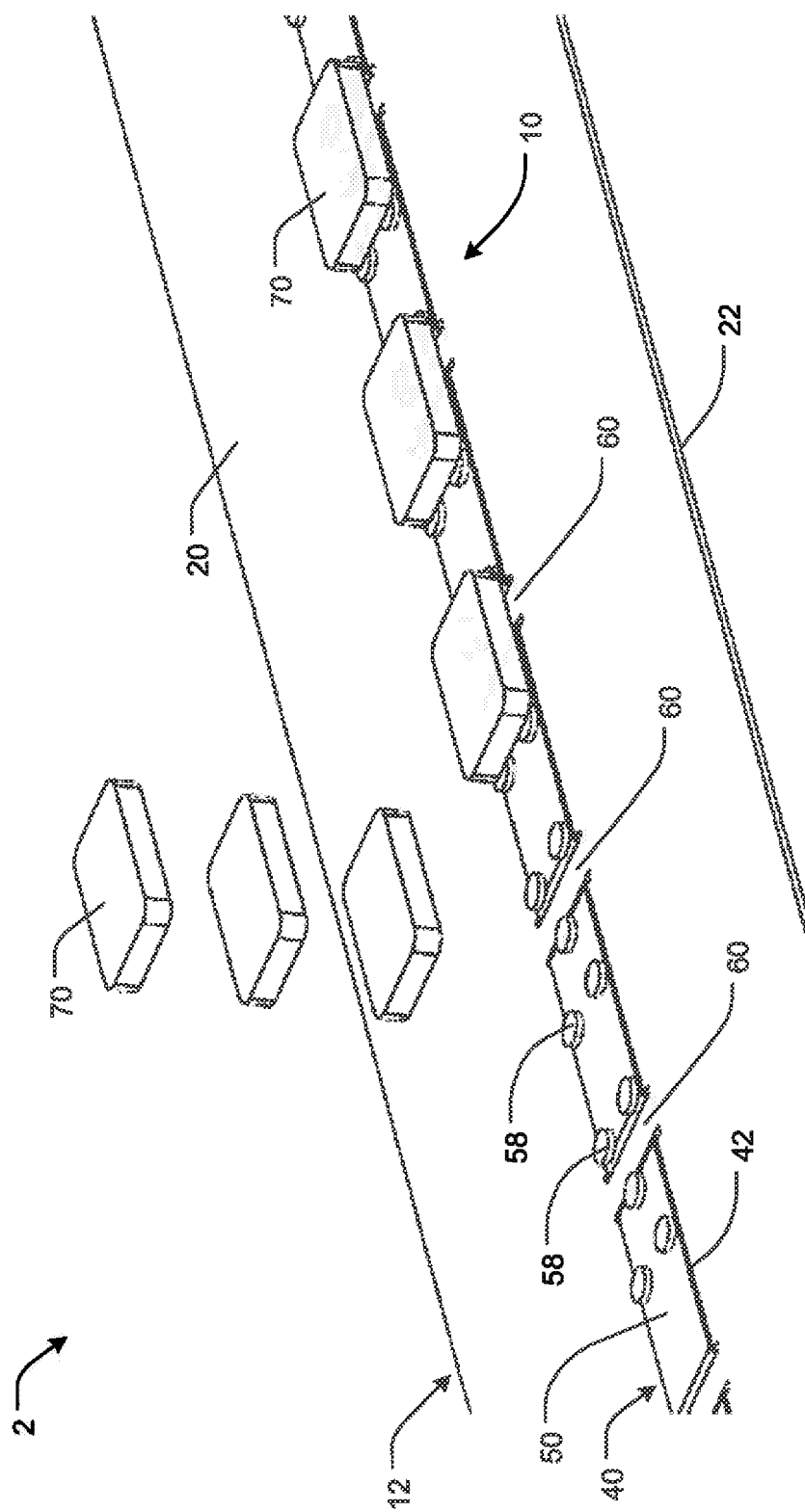
FIG. 3 is a close-up top perspective view of the electrically conductive pathway on the flexible, electrically insulating sheet of FIG. 1.

Referring now to FIGS. 1-3, there is shown an electrical apparatus 2, which may be a lighting apparatus such as strip lighting apparatus, particularly comprising an electrically conductive pathway 10 on a flexible, electrically insulating sheet 12.

As shown, the electrically conductive pathway 10 comprises a plurality of electrically conductive clips 40, and a plurality of electrical components 70 in electrically conductive relationship via the electrically conductive clips 40. In one embodiment the electrically conductive pathway 10 may provide an electrical circuit to power a plurality of electrical components 70 in the form of solid-state lighting sources, such as LED packages.

As shown by FIGS. 1-3, electrically insulting sheet 12 provides a mounting structure for the electrically conductive pathway 10 comprising the plurality of electrically conductive clips 40, and the plurality of electrical components 70 in electrically conductive relationship via the electrically conductive clips 40.

The electrically insulating sheet 12 may be formed as an elongated strip, particularly of a plastic composition. The plastic composition may comprise at least one polymer, such as a thermoplastic polyester. More particularly, the thermoplastic polyester may comprise at least one of polyethylene terephthalate (PET) and polyethylene napthalate (PEN).

Figure 4:
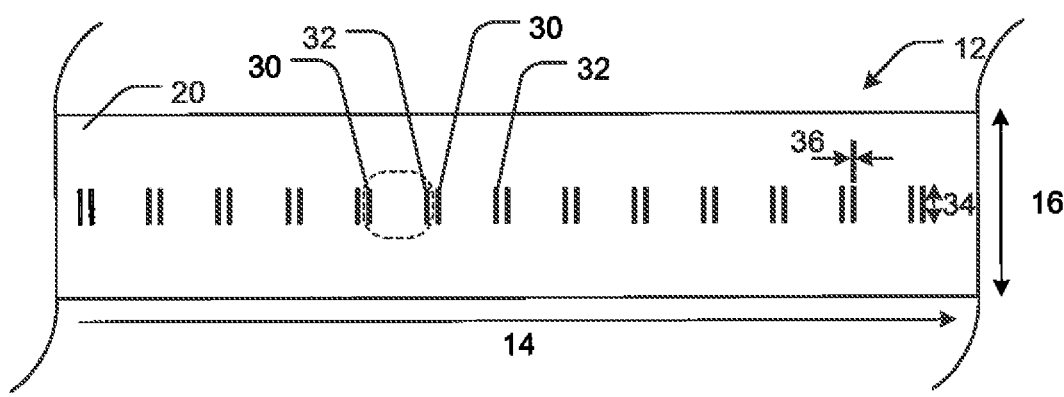
FIG. 4 is a top plan view the flexible, electrically insulating sheet of FIG. 1.

Electrically insulating sheet 12 may be extruded sheet obtained from an extruded roll of planar sheet-stock. As best shown in FIGS. 1 and 4, the electrically insulating sheet 12 has a length (major longitudinal) direction 14 (which extends in the machine direction of extrusion of the sheet 12, as well as the machine direction of assembly) and a width direction 16, which direction is transverse to the length/major longitudinal direction 14.

The roll of sheet-stock may be a supply roll of a roll-to-roll manufacturing process. As part of the manufacturing process, once the electrically conductive pathway 10 is formed, the electrically insulating sheet 12 may be taken up on a take up roll and/or subsequently cut into longitudinal sections having a predetermined length.

With regards to thickness, in certain exemplary embodiments, the electrically insulating sheet 12 may each have a thickness dimension of up to 0.008 inch (0.203 mm), such as in a range of 0.003 inch to 0.008 inch (0.076 mm to 0.203 mm).

In certain exemplary embodiments, the electrically insulating sheet 12 may have a width dimension in the width direction 16 in a range of 0.5 inch to 30 inches (12.7 mm to 76.2 mm), and more particularly in a range of 0.5 inch to 15 inches (12.7 mm to 381 mm).

In a preferred embodiment, the electrically insulating sheet 12 may be formed of white, thermally stabilized, highly reflective polyethylene terephthalate (PET) and have a thickness dimension of 0.005 inch (0.127 mm), and a width dimension of 1 inch (25 mm).

As shown, the electrically insulating sheet 12 has an upper face 20 and an opposed lower face 22. As best shown in FIG. 4, electrically insulating sheet 12 further comprises a plurality of pairs of adjacent apertures 30, 32, shown in the form of elongated slots, which are shown to be rectangular. Each corner of the apertures 30, 32 may be sharp, or may be rounded with a radius transition from one side of the aperture to an adjacent side of the aperture.

An exemplary pair of adjacent apertures 30, 32 is show in the area highlighted by the dotted rectangle of FIG. 4. Apertures 30, 32 may be formed by laser cutting of the electrically insulating sheet 12, particularly with a laser head positioned over the electrically insulating sheet 12 as it moves in the roll-to-roll manufacturing process.

As shown, each aperture 30, 32 of the pair of apertures 30, 32 is parallel with each other, and preferably has the same shape, as well as the same size, i.e. the same length (major longitudinal) and width dimensions. As shown, the length (major longitudinal) direction 34 of each aperture 30, 32 is transverse to the length (major longitudinal) direction 14 of electrically insulating sheet 12, and the width direction 36 of each aperture 30, 32 is parallel to the length (major longitudinal) direction 14 of electrically insulating sheet 12. Also as shown, the apertures 30, 32 are aligned in a singular row extending along a medial region of the length (major longitudinal) direction 14 of electrically insulating sheet 12.

In certain exemplary embodiments, each of the apertures 30, 22, may have a length (major longitudinal) dimension in a range of 0.063 inch to 0.189 inch (1.59 mm to 4.76 mm), and a width dimension in a range of 0.01 inch to 0.03 inch (0.25 mm to 0.76 mm). The dimension between adjacent apertures 30, 32 in the longitudinal direction 14 of the electrically insulating sheet 12 may be in a range of 0.1 inch to 0.2 inch (2.5 mm to 5 mm).

Figure 6:
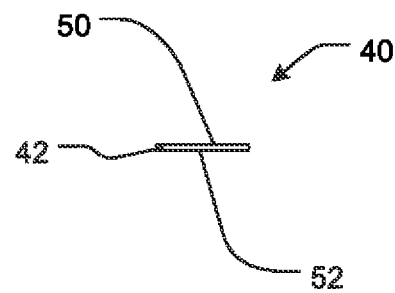
FIG. 6 is a cross sectional view of the electrically conductive clip of FIG. 1 taken along section line 6-6 of FIG. 5.

Each pair of apertures 30, 32 is used to mechanically fasten one of a plurality of electrically conductive clips 40 to the electrically insulating sheet 12. The electrically conductive clips 40 may be formed of metal, particularly a ductile (malleable) metal such as copper. The metal may have a polygonal shape in cross-section, such as a rectangular cross-sectional shape (see FIG. 6), and may be obtained from a roll, such as associated with metal (e.g. copper) ribbon. The thickness of the metal may be in a range of 0.0015 inch to 0.007 inch (0.0381 mm to 0.1778 mm), and the width of the metal may be in a range of 0.04 inch to 0.275 inch (1 mm to 7 mm).

As shown, each electrically conductive clip 40 comprises first (intermediate) body portion 42, and first and second depending legs 44, 46 located at opposing ends of the first body portion 42.

Figure 5:
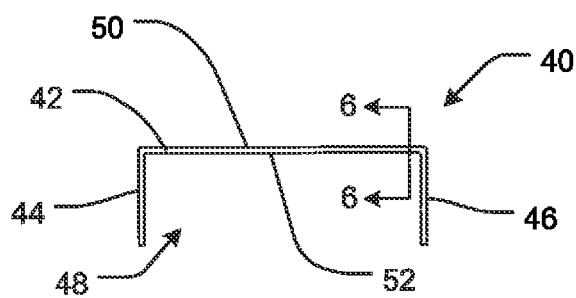
FIG. 5 is a close-up longitudinal side view of an electrically conductive clip of the electrically conductive pathway of FIG. 1 prior to being fastened to the flexible, electrically insulating sheet.

As best shown by FIG. 5, first and second legs 44, 46 may be initially angled substantially transverse/perpendicular (e.g. within 10 degrees of being perfectly transverse/perpendicular) to the first body portion 42 such that electrically conductive clip 40 is U-shaped, with a sheet-receiving recess 48 between the first and second legs 44, 46. Electrically conductive clip 40 may be formed into the U-shaped on a forming mandrel.

As best shown in FIGS. 1 and 2, in order to fasten each of the electrically conductive clips 40 to the electrically insulating sheet 12, each leg 44, 46 of one of the electrically conductive clips 40 may first be extended through one of the apertures 30, 32 of a pair of the apertures 30, 32 from the upper face 20 of the electrically insulating sheet 12 to the lower face 22 of the electrically insulating sheet 12. Such may be performed as part of a roll-to-roll manufacturing process using a multi-axis robot.

Thereafter, once each leg 44, 46 of one of the electrically conductive clips 40 is extended through one of the apertures 30, 32 of a pair of the apertures 30, 32 from the upper face 20 of the electrically insulating sheet 12 to the lower face 22 of the electrically insulating sheet 12, each leg 44, 46 of the electrically conductive clip 40 may then be bent or otherwise folded towards the first body portion 42 as shown progressively in FIG. 2, such that first body portion 42 is ultimately disposed in contacting relation with the upper face 20 of the electrically conductive sheet 12 and the first and second legs 44, 46 are disposed in contacting relation with the lower face 22 of the electrically insulating sheet 12.

More particularly, a lower face 52 of that first body portion 42 of the electrically conductive clip 40 contacts the upper face 20 of the electrically conductive sheet 12, and lower face 52 of the first and second legs 44, 46 of the electrically conductive clip 40 contacts the lower face 22 of the electrically conductive sheet 12. Even more particularly, the electrically insulating sheet 12 may be clamped between, on the one hand, the first body portion 42 of the electrically conductive clip 40 and, on the other hand, the first and second depending legs 44, 46 of the electrically conductive clip 40. As shown, the depending legs 44, 46 of the electrically conductive clip 40 are substantially parallel (e.g. within 10 degrees of being perfectly parallel) with the first body portion 42 of the electrically conductive clip 40.

Such forming of the electrically conductive clips 40 may be performed as part of a roll-to-roll manufacturing process by having an appropriately configured hammer impact the electrically conductive clips 40 from the upper face 50, which drives the legs into an appropriately configured anvil which bends/folds each of the legs 44, 46 beneath the first body portion 42 of the electrically conductive clip 40.

As best shown by FIGS. 1 and 3, after being fastened to the electrically insulating sheet 12, each of the electrically conductive clips 40 form a row extending longitudinally with electrically insulating sheet 12, particularly with a length (major longitudinal) direction 54 extending parallel to the length (major longitudinal) direction 14 of the electrically insulating sheet 12. The electrically conductive clips 40 may have a length (major longitudinal) dimension in the length direction 54 in a range of 0.1 inch to 1.5 inches (2.54 mm to 38.1 mm).

As shown, each of the electrically conductive clips 40 are separated spatially from one another by gap 60 adjacent each end of first body portion 42 of electrically conductive clips 40. The dimension of gap 60 in the longitudinal direction 14 of the electrically insulating sheet 12 is in a range of 0.04 inch to 0.118 inch (1 mm to 3 mm).

After two adjacent electrically conductive clips 40 have been fastened to the electrically insulating sheet 12, an electrical component 70 may be mounted in electrically conductive relationship to the adjacent electrically conductive clips 40, particularly by the electrical component 70 being mounted overlying the upper face 50 of the adjacent electrically conductive clips 40.

More particularly, as best shown in FIG. 3, after two adjacent electrically conductive clips 40 have been fastened to the electrically insulating sheet 12, one or more fastening pads 58 may be located on the upper face 50 of the electrically conductive clips 40, particularly adjacent the opposing longitudinal ends of the first body portion 42. The fastening pads 58 may be made of an electrically conductive polymer composition, such as epoxy, or solder, such as solder paste dispensed from a dispenser overlying the upper face 50 of the electrically conductive clips 40.

As shown in FIG. 3, once the fastening pads 58 are located on the upper face 50 of adjacent electrically conductive clips 40, an electrical component 70 may then be placed in overlying relationship on top of, and in contact with, the fastening pads 58 of the adjacent electrically conductive clips 40. When the electrical component 70 are placed in overlying relationship on top of the fastening pads 58, the fastening pads 58 may be used to mechanically and/or adhesively bond the electrical component 70 to the electrically conductive clips 40, particularly via hardening of epoxy or solder in a known manner.

For example, the electrical component 70 may be placed in overlying relationship on top of the fastening pads 58 when the fastener pads are in a molten and/or flowable state, and thereafter cool and/or harden to a solid state to mechanically and/or adhesively bond the electrical component 70 to the electrically conductive clips 40.

Alternatively, and preferably, the electrical component 70 may by fastened to the electrically conductive clips 40 using a solder reflow process. For, example, the electrical component 70 may be placed in overlying relationship on top of the fastening pads 58 when the fastener pads 58 are is a non-solid solid state. As the electrically conductive sheet 12 moves in the machine direction, the sheet 12 may pass through a heating station which heats the fastening pads 58 (along with the electrically conductive clips 40 and electrical components 70) to a molten and/or flowable state, and thereafter subsequently cooled to a solid state to thereby mechanically and/or adhesive bond the electrically conductive clips 40 and electrical components 70 together.

After assembly of the electrical component 70 to the adjacent electrically conductive clips 40, the electrical component 70 may be understood to bridge the gap 60 and the insulating sheet 12 between the electrically conductive clips 40, thereby defining the electrically conductive pathway 10, with the connection of the electrical component 70 to one of the adjacent electrically conductive clips 40 functioning as an anode, and the connection of the electrical component 70 to the other of the adjacent electrically conductive clips 40 functioning as a cathode.

The electrically conducting sheet 12 with the electrically conductive pathway 10 may then be wound up on a take-up roll. The electrical components 70 may comprise a plurality of solid-state light source, which more particularly comprise semiconductor light-emitting diodes (LEDs), which may include organic light-emitting diodes (OLEDs) and/or polymer light-emitting diodes (PLEDs).

In order to provide electrically insulating sheet 12 into predetermined lengths, such as for strip lighting, at certain locations of the electrically insulating sheet 12, an electrical component 70 may not span the gap 60 between said two adjacent electrically conductive clips 40 and may be absent. In such situation, the electrically insulating sheet 12 may be severed transverse to the longitudinal direction 14, particularly between the two adjacent electrically conductive clips 40 at the middle of the gap 60. Thereafter, as shown in FIG. 1, an electrically conductive extension 80 (e.g. planar copper ribbon or circular wire) may be fastened to a longitudinal end of the first body portion 42 of the electrically conductive clip 40 at the location where the electrical component 70 is absent. In such manner, the opposing end of the electrically conductive extension 80 may be used to couple the resulting electrical apparatus 2 to a power source.

While a single row of electrically conductive clips 40 and electrical components 70 is shown in the exemplary embodiment of FIGS. 1-3, it should be understood that a plurality of rows of electrically conductive clips 40 and electrical components 70 may be provided on a single electrically insulating sheet 12 as suitable, depending on the width dimension of the electrically insulating sheet 12 in the width direction 16.

While a preferred embodiment of the present disclosure has been described, it is understood that various adaptations and modifications can be made therein without departing from the spirit of the disclosure and the scope of the appended claims. The scope of the disclosure should, therefore, be determined not with reference to the above description, but instead should be determined with reference to the appended claims along with their full scope of equivalents. Furthermore, it should be understood that the appended claims do not necessarily comprise the broadest scope of the disclosure which the applicant is entitled to claim, or the only manner in which the disclosure may be claimed, or that all recited features are necessary.

LISTING OF REFERENCE CHARACTERS 2 electrical apparatus
10 electrically conductive pathway
12 electrically insulating sheet
14 sheet length (major longitudinal) direction
16 sheet width direction
20 sheet upper face
22 sheet lower face
30 aperture
32 aperture
34 aperture length (major longitudinal) direction
36 aperture width direction.
40 electrically conductive clip
42 clip first (main) body portion
44 clip leg
46 clip leg
48 sheet receiving recess
50 clip upper face
52 clip lower face
58 fastening pad
60 clip gap
70 electrical component
80 electrically conductive extension

We claim:

1. A conductive pathway (10) mounted on an electrically insulating sheet (12), comprising:
the electrically insulating sheet (12) having an upper face (20) and an opposed lower face (22), said electrically insulating sheet having a plurality of pairs of apertures (30, 32);
a plurality of electrically conductive clips (40), each electrically conductive clip (40) being separated spatially from an adjacent said electrically conductive clip (40);
each electrically conductive clip (40) comprising a first body portion (42) and first and second depending legs (44, 46), said first and second legs defining a sheet-receiving recess (48) therebetween, said first body portion (42) being disposed in contacting relation with said upper face (20) of said electrically insulating sheet (12) and said first and second legs (44, 46) being disposed in directly contacting relation with said lower face (22) of said electrically insulating sheet (12);
each leg (44, 46) of one of said electrically conductive clips (40) extending through a respective one of said apertures (30, 32) of a said pair of said apertures (30, 32) from said upper face (20) of said electrically insulating sheet (12) to said lower face (22) of said electrically insulating sheet (12); and
a plurality of electrical components (70), each electrical component (70) mounted in conductive relationship to two adjacent said electrically conductive clips (40), thereby defining said conductive pathway (10).

2. The conductive pathway (10) of claim 1, wherein:
said sheet (12) is clamped between said first body portion (42) and said first and second depending legs (44, 46).

3. The conductive pathway (10) of claim 1, wherein:
each electrically conductive clip (40) of said plurality of electrically conductive clips (40) is formed of metal.

4. The conductive pathway (10) of claim 3, wherein:
said metal of each electrically conductive clip (40) has a thickness in a range of 0.0015 inch to 0.007 inch.

5. The conductive pathway (10) of claim 3, wherein:
said metal of each electrically conductive clip (40) has a polygonal shape in cross-section.

6. The conductive pathway (10) of claim 5, wherein:
said polygonal shape is rectangular.

7. The conductive pathway (10) of claim 1, wherein:
said first and second depending legs (44, 46) of each electrically conductive clip (40) are substantially parallel with said first body portion (42) of each clip.

8. The conductive pathway (10) of claim 1, wherein:
said electrically insulating sheet (12) has a longitudinal direction and a width direction transverse to said longitudinal direction;
each electrically conductive clip (40) of said plurality of electrically conductive clips (40) has a longitudinal direction; and
said longitudinal direction of each of said electrically conductive clips (40) is parallel to said longitudinal direction of said electrically insulating sheet (12).

9. The conductive pathway (10) of claim 1, wherein:
said two adjacent electrically conductive clips (40) are separated spatially by a gap (60) located therebetween; and
each electrical component (70) mounted in conductive relationship to said two adjacent electrically conductive clips (40) bridges said gap (60) between said two adjacent electrically conductive clips (40).

10. The conductive pathway (10) of claim 1, wherein:
each of said apertures (30, 32) of said plurality of pairs of apertures (30, 32) is rectangular.

11. The conductive pathway (10) of claim 10, wherein:
said electrically insulating sheet (12) has a longitudinal direction and a width direction transverse to said longitudinal direction;
each of said rectangular apertures (30, 32) of the plurality of apertures (30, 32) has a longitudinal direction; and
said longitudinal direction of each of said rectangular apertures (30, 32) of said plurality of apertures (30, 32) is transverse to said longitudinal direction of said electrically insulating sheet (12).

12. The conductive pathway (10) of claim 1, wherein:
each of said apertures (30, 32) of said plurality of pairs of apertures (30, 32) have at least one of a same size and a same shape.

13. The conductive pathway (10) of claim 1, wherein:
said electrically insulating sheet (12) is formed of a plastic composition comprising at least one polymer.

14. The conductive pathway (10) of claim 13, wherein:
said at least one polymer comprises at least one of polyethylene terephthalate and polyethylene napthalate.

15. The conductive pathway (10) of claim 1, wherein:
said electrically insulating sheet (12) has a thickness in a range of 0.003 inch to 0.008 inch.

16. The conductive pathway (10) of claim 1, wherein:
each electrical component (70) of said plurality of electrical components (70) comprises a solid-state light source.

17. The conductive pathway (10) of claim 1, wherein:
each electrical component (70) of said plurality of electrical components (70) is mounted to said two adjacent electrically conductive clips (40) by a fastening pad (58).

18. The conductive pathway (10) of claim 17, wherein:
said fastening pad (58) is formed of an electrically conductive polymer composition or metal solder.

19. The conductive pathway (10) of claim 1, wherein each said electrical component (70) mounted in conductive relationship to two adjacent said electrically conductive clips (40) is bridging said insulating sheet (12).

20. The conductive pathway (10) of claim 1, wherein said conductive clips (40) are clamped in contacting relation with said upper and lower faces (20, 22) of said insulating sheet (12) devoid of an adhesive.

* * * * *